(12) United States Patent
Yamanaka (10) Patent No.: US 10,562,150 B2
(45) Date of Patent: Feb. 18, 2020

(54) POLISHING APPARATUS (71) Applicant: DISCO CORPORATION, Tokyo (JP)

(72) Inventor: Satoshi Yamanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 196 days.

(21) Appl. No.: 15/673,972

(22) Filed: Aug. 10, 2017

(65) Prior Publication Data
US 2018/0050436 A1 Feb. 22, 2018

(30) Foreign Application Priority Data

Aug. 18, 2016 (JP) .................. 2016-160492

(51) Int. Cl.
*B24B 57/02* (2006.01)
*H01L 21/304* (2006.01)
*B24B 37/34* (2012.01)
*H01L 21/306* (2006.01)

(52) U.S. Cl.
CPC ............ *B24B 57/02* (2013.01); *B24B 37/345* (2013.01); *H01L 21/304* (2013.01); *H01L 21/30625* (2013.01)

(58) Field of Classification Search
CPC ................ H01L 21/304–3046; B24B 5/00–50
USPC .................................................... 156/345.18
See application file for complete search history.

(56) References Cited

U.S. PATENT DOCUMENTS

| | | | | |
|---|---|---|---|---|
| 3,031,363 A * | 4/1962 | Soper | ........................ | C23F 1/00 438/747 |
| 5,816,900 A * | 10/1998 | Nagahara | ................ | B24B 37/24 451/285 |
| 6,095,899 A * | 8/2000 | Elmar | ..................... | B24B 7/228 451/28 |
| 6,135,865 A * | 10/2000 | Beardsley | ............... | B24B 37/16 451/285 |
| 6,291,350 B1 * | 9/2001 | Hashimoto | ............... | B24B 1/04 438/692 |
| 6,402,598 B1 * | 6/2002 | Ahn | ...................... | B24B 37/345 451/288 |
| 2003/0077989 A1 * | 4/2003 | Isobe | .................... | B24B 37/005 451/65 |
| 2005/0092620 A1 * | 5/2005 | Mavliev | .................. | B23H 5/08 205/662 |

(Continued)

FOREIGN PATENT DOCUMENTS

| | | |
|---|---|---|
| JP | 09-314466 | 12/1997 |
| JP | 2011-101913 | 5/2011 |

*Primary Examiner* — Aiden Lee
(74) *Attorney, Agent, or Firm* — Greer Burns & Crain Ltd.

(57) ABSTRACT

A polishing apparatus includes a slurry circulating unit for storing a slurry below a chuck table having a holding surface for holding a wafer, and circulating the slurry to a polishing surface of a polishing pad for polishing the wafer. The slurry circulating unit includes an annular cup-shaped receptacle that surrounds the chuck table and the polishing pad overhanging from the holding surface of the chuck table in a polishing position where the polishing surface is in contact with the wafer, an air blow opening formed through a bottom plate of the receptacle for blowing air to thereby spray the slurry stored in the receptacle toward the polishing pad, a pipe for connecting the air blow opening to an air source, an opening formed through a side wall of the pipe, and a valve for controlling the supply and stop of air from the air source to the pipe.

18 Claims, 5 Drawing Sheets

(56) References Cited

U.S. PATENT DOCUMENTS

2008/0050924 A1* 2/2008 Wakabayashi .... H01L 21/67017
438/706
2012/0252212 A1* 10/2012 Nishida ................. H01L 21/304
438/691

* cited by examiner

POLISHING APPARATUS

BACKGROUND OF THE INVENTION

Field of the Invention

The present invention relates to a polishing apparatus for polishing a wafer as supplying a slurry.

Description of the Related Art

Prior to dividing a platelike workpiece such as a semiconductor wafer into chips by using a cutting apparatus or the like, the back side of the wafer opposite to the front side where devices are formed is ground by using a grinding apparatus to thereby reduce the thickness of the wafer to a predetermined thickness. However, in many cases, grinding strain is left on the back side of the wafer due to grinding. As a result, there arises a problem such that the die strength of each semiconductor chip obtained by dividing the wafer may be reduced to cause easy bend.

To solve this problem, the back side of the wafer ground is polished to remove the grinding strain and thin each semiconductor chip to a finished thickness. Accordingly, the die strength of each semiconductor chip obtained by dividing the wafer can be increased. As a polishing apparatus capable of removing the grinding strain to form a surface having excellent planarity, there is a polishing apparatus using CMP (Chemical Mechanical Polishing) to polish a wafer with planarization.

In general, the polishing apparatus using CMP has a configuration such that a polishing pad formed from a nonwoven fabric not containing abrasive, for example, is located below a wafer, and a holding member for holding the wafer is located above the polishing pad. In polishing the wafer, the polishing pad is rotated and the wafer held by the holding member is brought into contact with the polishing pad. Further, a polishing liquid (slurry) containing loose abrasive is supplied to a contact area between the polishing pad and the wafer by operating slurry supplying means. In a dedicated apparatus for performing polishing only, there has been proposed that the slurry used during polishing is recovered to a tank, for example, and this slurry recovered to the tank is circulated for reuse by using a circulating pump (see Japanese Patent No. 3384530, for example).

There has also been proposed a processing apparatus capable of performing both grinding and polishing. This processing apparatus has a configuration such that a chuck table for holding a wafer is located below the wafer, and grinding means and polishing means are located above the chuck table (see Japanese Patent No. 5406676, for example). In polishing the wafer after grinding, the polishing pad is brought into pressure contact with the wafer held on the chuck table, and a slurry is supplied to the wafer during polishing.

SUMMARY OF THE INVENTION

However, in the above-mentioned polishing apparatus capable of circulating the slurry for reuse, the slurry continues to be supplied to the polishing surface of the polishing pad in polishing the wafer, so that the amount of the slurry to be used is increased to cause poor economy. On the other hand, in the above-mentioned processing apparatus, the slurry supplied to the wafer falls down from the outer circumference of the chuck table holding the wafer, and this slurry is mixed with a grinding waste liquid generated in grinding the wafer, so that it is difficult to reuse the slurry containing the grinding waste liquid. In the case of reusing this slurry, the configuration of the processing apparatus must be changed so that the slurry supplied is not mixed with the grinding waste liquid. However, this configuration is difficult to achieve. Further, it is also difficult to recover only the slurry from the mixture of the slurry and the grinding waste liquid. As a result, the slurry reusable is discarded with the grinding waste liquid, and a large amount of slurry is wasted accordingly.

It is therefore an object of the present invention to provide a polishing apparatus for polishing a wafer as supplying a slurry, wherein the slurry can be efficiently circulated for reuse.

In accordance with an aspect of the present invention, there is provided a polishing apparatus including a chuck table having a holding surface for holding a wafer; polishing means including a rotatable polishing pad having a polishing surface for polishing the wafer held on the chuck table; slurry supplying means for supplying a slurry to the polishing surface; feeding means for feeding the polishing means in a direction toward or away from an upper surface of the wafer held on the chuck table; and slurry circulating means for storing the slurry below the chuck table and circulating the slurry to the polishing surface of the polishing pad; the slurry circulating means including an annular cup-shaped receptacle configured so as to surround the chuck table and the polishing pad overhanging from the holding surface of the chuck table in a polishing position where the polishing surface of the polishing pad is in contact with the wafer held on the chuck table; an air blow opening formed through a bottom plate portion of the receptacle for blowing air to thereby spray the slurry stored in the receptacle toward the polishing surface of the polishing pad overhanging from the holding surface of the chuck table; a pipe for connecting the air blow opening to an air source; an opening formed through a side wall of the pipe; and a valve for controlling the supply and stop of air from the air source to the pipe; wherein in storing the slurry into the receptacle, the valve is opened to supply the air from the air source to the pipe, and the slurry supplied to the polishing surface by the slurry supplying means is stored into the receptacle by blowing the air from the air blow opening, whereas in draining the slurry from the receptacle, the valve is closed to stop the supply of the air and use the air blow opening as a slurry drain opening, so that the slurry is allowed to flow in the pipe in the direction opposite to the flow direction of the air, and is finally drained from the opening of the pipe.

Preferably, the slurry circulating means further includes a restrictor provided in a portion of the pipe between the air source and the opening of the pipe for adjusting the flow rate of air supplied from the air source to the pipe; the restrictor including a first restriction valve for adjusting the flow rate of air in the pipe to a first flow rate in storing the slurry into the receptacle, a second restriction valve adapted to open wider than the first restriction valve for adjusting the flow rate of air in the pipe to a second flow rate greater than the first flow rate in spraying the slurry stored in the receptacle toward the polishing surface of the polishing pad overhanging from the holding surface of the chuck table, and switching means for switching between the first restriction valve and the second restriction valve.

According to the present invention, a small amount of slurry can be circulated during polishing of the wafer, thereby suppressing the consumption of the slurry. Further, every time the wafer to be polished is exchanged, the slurry stored in the receptacle is exchanged, so that the uniformity of polishing between the wafers can be ensured. In exchanging the slurry, the supply of a new slurry into the receptacle and the drainage of an old slurry from the receptacle can be controlled by controlling the supply and stop of air to the pipe. Accordingly, the slurry can be easily exchanged without complicating the configuration of the polishing apparatus.

In the case that the slurry circulating means includes the first restriction valve for adjusting the flow rate of air in the pipe to a first flow rate in storing the slurry into the receptacle, the second restriction valve adapted to open wider than the first restriction valve for adjusting the flow rate of air in the pipe to a second flow rate greater than the first flow rate in spraying the slurry stored in the receptacle toward the polishing surface of the polishing pad overhanging from the holding surface of the chuck table, and the switching means for switching between the first restriction valve and the second restriction valve, it is possible to easily switch between the storage of the slurry into the receptacle and the supply of the slurry stored in the receptacle to the polishing surface of the polishing pad.

The above and other objects, features and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1:
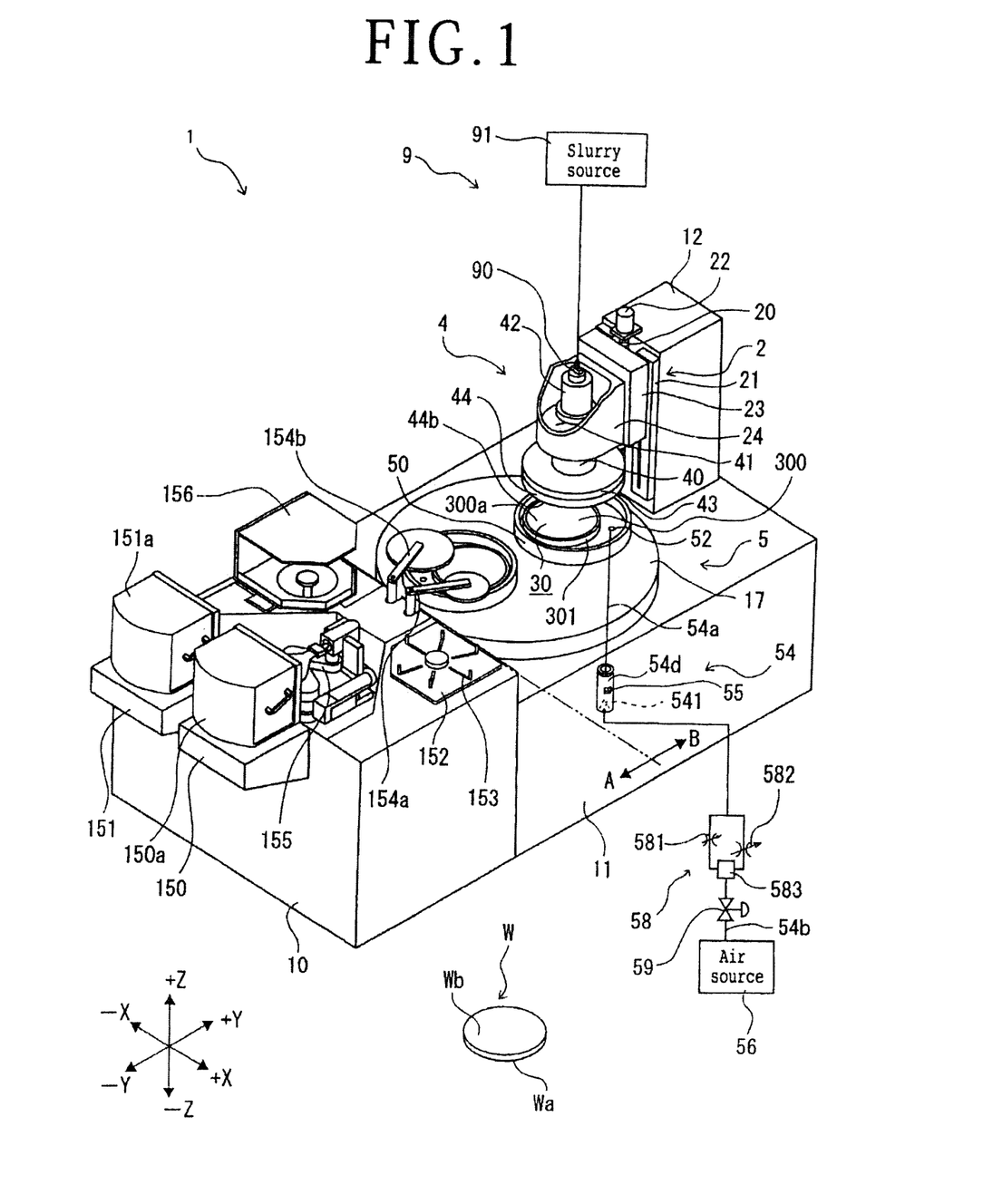
FIG. 1 is a perspective view depicting a polishing apparatus according to a preferred embodiment of the present invention.

Referring to FIG. 1, there is depicted a polishing apparatus 1 according to a preferred embodiment of the present invention. The polishing apparatus 1 is an apparatus for polishing a wafer W held on a chuck table 30 by using polishing means 4. The polishing apparatus 1 includes a first base 10 and a second base 11 connected to the first base 10 at its rear end (+Y side). The upper side of the first base 10 functions as a load/unload area A where the wafer W is loaded/unloaded. The upper side of the second base 11 functions as a working area B where the wafer W is polished by the polishing means 4.

The wafer W depicted in FIG. 1 is a disk-shaped semiconductor wafer (e.g., silicon wafer). A plurality of devices (not depicted) are formed on the lower surface Wa of the wafer W. A protective tape (not depicted) is attached to the lower surface Wa of the wafer W to thereby protect the lower surface Wa. The upper surface Wb of the wafer W is a surface to be polished.

The front side (-Y side) of the first base 10 is provided with a first cassette mounting portion 150 and a second cassette mounting portion 151. A first cassette 150a for storing a plurality of wafers W to be polished is mounted on the first cassette mounting portion 150. A second cassette 151a for storing a plurality of wafers W polished is mounted on the second cassette mounting portion 151.

A robot 155 is provided on the rear side (+Y side) of the first cassette 150a. The robot 155 functions to take each wafer W out of the first cassette 150a before polishing and also to store each wafer W into the second cassette 151a after polishing. A temporary setting area 152 is formed adjacent to the robot 155 on the rear side thereof. Positioning means 153 is provided in the temporary setting area 152. The wafer W taken out of the first cassette 150a is transferred to the temporary setting area 152 by the robot 155. In the temporary setting area 152, the wafer W is set at a predetermined position by the positioning means 153.

A loading arm 154a is provided adjacent to the positioning means 153. The loading arm 154a is adapted to hold the wafer W before polishing and is horizontally swingable. That is, the loading arm 154a functions to hold the wafer W positioned by the positioning means 153 and then transfer the wafer W to the chuck table 30 provided in the working area B. An unloading arm 154b is provided adjacent to the loading arm 154a. The unloading arm 154b is adapted to hold the wafer W after polishing and is horizontally swingable. That is, the unloading arm 154b functions to hold the wafer W held on the chuck table 30 after polishing and then transfer the wafer W to cleaning means 156 provided adjacent to the unloading arm 154b. The cleaning means 156 functions to clean the wafer W transferred by the unloading arm 154b after polishing. The wafer W cleaned by the cleaning means 156 is stored into the second cassette 151a by the robot 155.

As depicted in FIG. 1, a turn table 17 is provided on the second base 11, and two chuck tables 30 are provided on the upper surface of the turn table 17 so as to be spaced 180° apart in the circumferential direction of the turn table 17. The number of the chuck tables 30 is not limited. For example, three or more chuck tables 30 may be equally spaced in the circumferential direction of the turn table 17. A rotational shaft (not depicted) is provided at the center of the turn table 17, wherein the turn table 17 is rotatable about the axis of the rotational shaft. By rotating the turn table 17, the two chuck tables 30 provided on the turn table 17 are also rotated about the axis of the rotational shaft of the turn table 17. Accordingly, one of the two chuck tables 30 set at a standby position near the temporary setting area 152 before polishing can be moved to a working position directly below the polishing means 4. On the other hand, the other chuck table 30 set at the working position can be moved to the standby position after polishing.

Figure 2:
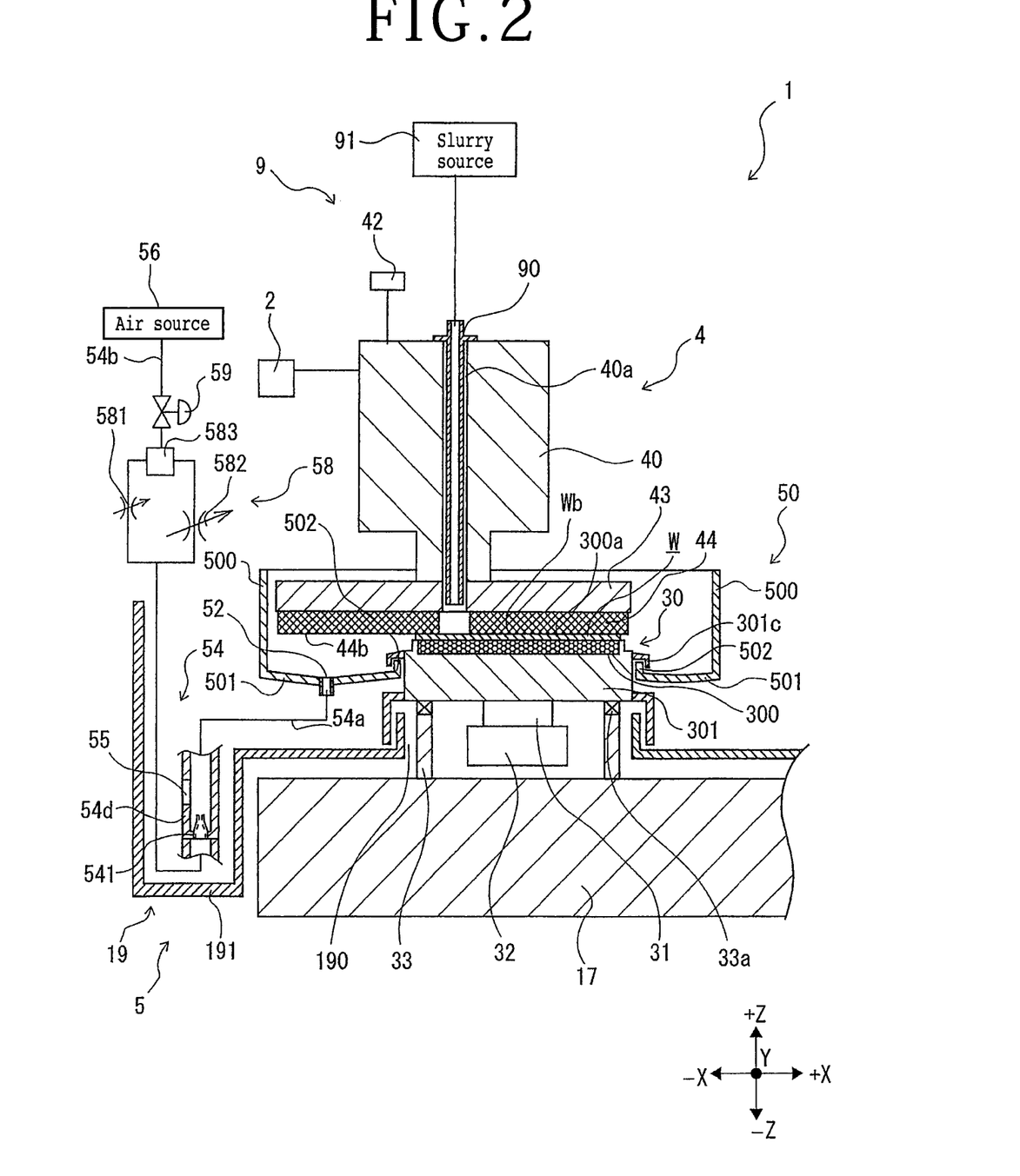
FIG. 2 is a sectional view depicting the configuration of polishing means, a chuck table, and slurry circulating means included in the polishing apparatus depicted in FIG. 1.

The two chuck tables 30 have the same configuration. Each chuck table 30 for holding the wafer W under suction has a circular outside shape and includes a suction holding portion 300 formed of a porous material for holding the wafer W under suction and a frame member 301 for supporting the suction holding portion 300. The suction holding portion 300 is in communication with a vacuum source (not depicted) for producing a suction force. The suction force produced by the vacuum source is transmitted to a holding surface 300a as an exposed surface of the suction holding portion 300. Accordingly, the wafer W can be held under suction on the holding surface 300a of the chuck table 30. As depicted in FIG. 2, a cylindrical support member 33 is provided below the chuck table 30 to support the chuck table 30. The lower end of the support member 33 is fixed to the upper surface of the turn table 17. A thrust bearing 33a is mounted on the upper end of the support member 33. Accordingly, the chuck table 30 is rotatably supported through the thrust bearing 33a to the support member 33. A rotational shaft 31 having an axis extending in the Z direction is provided inside the cylindrical support member 33. The upper end of the rotational shaft 31 is fixed to the lower surface of the chuck table 30 at its center. Rotating means 32 such as a motor for rotating the rotational shaft 31 is connected to the lower end of the rotational shaft 31. Accordingly, when the rotational shaft 31 is rotated by the rotating means 32, the chuck table 30 can be rotated above the turn table 17 at a predetermined speed.

As depicted in FIG. 1, a rectangular column 12 is provided on the second base 11 at its rear portion (+Y side), and feeding means 2 for feeding the polishing means 4 in the Z direction is provided on the front side surface (−Y side) of the column 12. The feeding means 2 includes a ball screw 20 having an axis extending in the Z direction (vertical direction), a pair of guide rails 21 parallel to the ball screw 20, a motor 22 connected to the ball screw 20 for rotating the ball screw 20, a movable plate 23 having an internal nut engaged with the ball screw 20 and having a rear side surface (+Y side) adapted to slide on the guide rails 21, and a holder 24 connected to the movable plate 23 on its front side surface (−Y side) for holding the polishing means 4. Accordingly, when the motor 22 is operated to rotate the ball screw 20, the movable plate 23 is moved in the Z direction along the guide rails 21, so that the polishing means 4 held by the holder 24 is fed in the Z direction.

Figure 3:
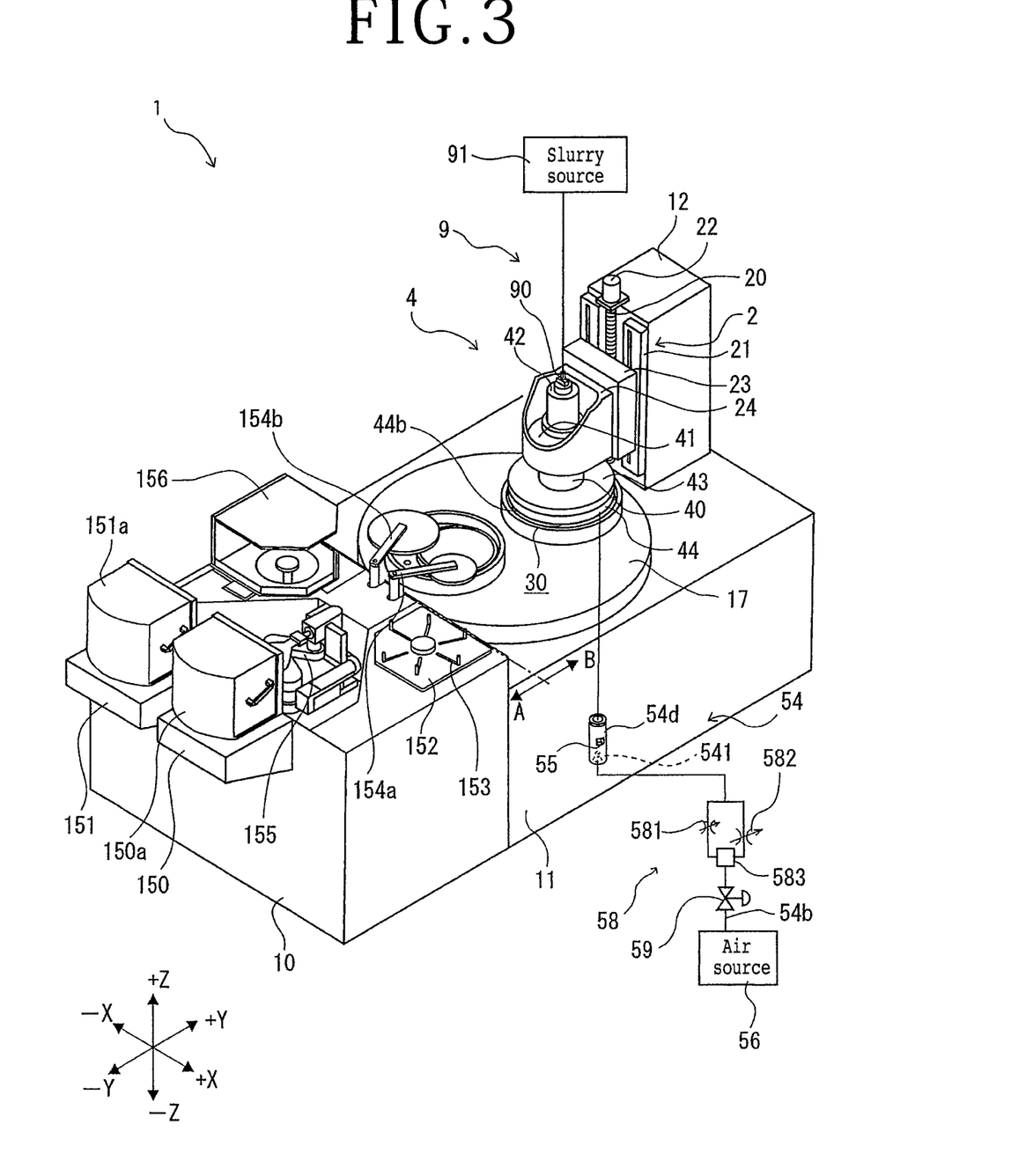
FIG. 3 is a view similar to FIG. 1, depicting a condition obtained by lowering the polishing means to bring a polishing pad into contact with a wafer held on the chuck table.

The polishing means 4 includes a spindle 40 having an axis extending in the Z direction (vertical direction), a housing 41 for rotatably supporting the spindle 40, a motor 42 for rotationally driving the spindle 40, a disk-shaped mount 43 fixed to the lower end of the spindle 40, and a circular polishing pad 44 detachably mounted on the lower surface of the mount 43. The polishing pad 44 is formed from a nonwoven fabric such as felt. As depicted in FIG. 3, a through hole 44a for allowing the pass of a slurry is formed at the center of the polishing pad 44. The lower surface of the polishing pad 44 functions as a polishing surface 44b for polishing the wafer W. The polishing pad 44 has a diameter substantially equal to the diameter of the mount 43 and larger than the diameter of the chuck table 30. Further, as depicted in FIG. 2, a through hole 40a extending in the Z direction is formed in the spindle 40 at its center. The through hole 40a is in communication with slurry supplying means 9. Further, a through hole 43a is also formed in the mount 43 at its center so as to communicate with the through hole 40a of the spindle 40 and the through hole 44a of the polishing pad 44.

The slurry supplying means 9 includes a slurry supply pipe 90 inserted in the through hole 40a of the spindle 40 and the through hole 43a of the mount 43 and a slurry source 91 such as a pump connected to the upper end of the slurry supply pipe 90. A slurry is supplied from the slurry source 91 through the slurry supply pipe 90 and discharged downward from the lower end (opening) of the slurry supply pipe 90 toward the polishing pad 44. Accordingly, the slurry discharged reaches a contact area between the polishing surface 44b of the polishing pad 44 and the wafer W. The slurry stored in the slurry source 91 is a solution containing loose abrasive such as $SiO_2$, $Al_2O_3$, $CeO_2$, SiC, $ZrO_2$, and $TiO_2$.

The polishing apparatus 1 includes slurry circulating means 5 for storing the slurry below the chuck table 30 and circulating the slurry to the polishing surface 44b of the polishing pad 44. The slurry circulating means 5 includes an annular cup-shaped receptacle 50 configured so as to surround the chuck table 30 and the polishing pad 44 overhanging from the holding surface 300a of the chuck table 30 in a polishing position where the polishing surface 44b of the polishing pad 44 is in contact with the wafer W held on the chuck table 30 as depicted in FIG. 2. In this polishing position, the center of rotation of the chuck table 30 is shifted from the center of rotation of the polishing pad 44 in the +X direction by a predetermined distance, and the outer circumference of the holding surface 300a of the chuck table 30 is partially overlapped with the outer circumference of the polishing surface 44b of the polishing pad 44 as depicted in FIG. 2, so that the polishing surface 44b of the polishing pad 44 comes into contact with the whole of the upper surface Wb of the wafer W. However, the polishing position where the polishing surface 44b of the polishing pad 44 is in contact with the wafer W held on the chuck table 30 is not limited to the position depicted in FIG. 2 in this preferred embodiment, but it is only necessary that the polishing surface 44b of the polishing pad 44 is in contact with the whole of the upper surface Wb of the wafer W during polishing.

The receptacle 50 depicted in FIG. 2 is rotatable with the chuck table 30 about the axis of rotation of the turn table 17 by the rotation of the turn table 17. The receptacle 50 is composed of an outer wall portion 500, a bottom plate portion 501, and an inner wall portion 502. The outer wall portion 500 is so formed as to surround the polishing pad 44 and the chuck table 30 in the polishing position where the polishing surface 44b of the polishing pad 44 is in contact with the wafer W held on the chuck table 30. The bottom plate portion 501 is integrally connected at its outer circumference to the lower end of the outer wall portion 500 and has an opening for exposing the holding surface 300a of the chuck table 30 in the +Z direction. The inner wall portion 502 is integrally connected at its lower end to the inner circumference of the opening of the bottom plate portion 501 so as to project upwardly.

The outer wall portion 500 has a height higher than the height of the polishing pad 44 in the polishing position where the polishing surface 44b of the polishing pad 44 is in contact with the wafer W held on the chuck table 30. Accordingly, the periphery of the polishing pad 44 and the periphery of the chuck table 30 are covered with the outer wall portion 500 during polishing, so that the slurry can be prevented from scattering to the outside of the receptacle 50 during polishing. In the case that the slurry supplied is stored into the receptacle 50 during polishing, the slurry can be stored up to a predetermined level near the upper end of the inner wall portion 502. A skirt portion 301c is formed on the outer circumferential surface of the frame member 301 constituting the chuck table 30 so as to project horizontally and downwardly (−Z direction). The skirt portion 301c is so formed as to surround the inner wall portion 502 of the receptacle 50. Accordingly, the skirt portion 301c functions to prevent that the slurry flowing down from the holding surface 300a of the chuck table 30 may enter the gap between the inner wall portion 502 and the chuck table 30.

The bottom plate portion 501 of the receptacle 50 is formed with a through hole extending through the thickness of the bottom plate portion 501. This through hole functions as an air blow opening 52 for blowing air to thereby spray the slurry stored in the receptacle 50 toward the polishing surface 44b of the polishing pad 44 in the +Z direction. A pipe 54 is connected at one end 54a thereof to the air blow opening 52. The air blow opening 52 has a diameter of approximately 8 to 10 mm, for example. The other end 54b of the pipe 54 is connected to an air source 56 such as a compressor. In FIGS. 1 and 2 and FIGS. 3 to 5 to be hereinafter referred to, most of the pipe 54 is simply depicted by a solid line, and a part of the pipe 54 is specifically depicted. While the air blow opening 52 is formed as a single opening through the bottom plate portion 501 of the receptacle 50 in this preferred embodiment, a plurality of air blow openings may be formed through the bottom plate portion 501 so as to be arranged at given intervals in the circumferential direction of the bottom plate portion 501.

As depicted in FIGS. 1 and 2, an opening 55 having a predetermined size is formed through the side wall 54d of the pipe 54. The size of the opening 55 may be suitably changed according to the storage volume of the receptacle 50 capable of storing the slurry, wherein this storage volume is defined by the height of the inner wall portion 502 of the receptacle 50, the area of the bottom plate portion 501 of the receptacle 50, and the height of the outer wall portion 500 of the receptacle 50 corresponding to the height of the inner wall portion 502. A hose nipple 541 is provided in the pipe 54 at a position near the opening 55 on the air source 56 side, i.e., on the upstream side of the opening 55 in the flow direction of air in the pipe 54. The hose nipple 541 has a diameter smaller than the inner diameter of the pipe 54. The hose nipple 541 functions to increase the flow velocity of air flowing in the pipe 54 from the air source 56 to the air blow opening 52. As a modification, the hose nipple 541 may not be provided in the pipe 54.

As depicted in FIG. 2, a valve 59 for controlling the supply and stop of air from the air source 56 to the pipe 54 and a restrictor 58 for adjusting the flow rate of air to be supplied from the air source 56 to the pipe 54 are provided in a portion of the pipe 54 between the air source 56 and the opening 55. The valve 59 is provided on the upstream side of the restrictor 58 in the flow direction of air in the pipe 54. The restrictor 58 includes a first restriction valve 581, a second restriction valve 582 adapted to open wider than the first restriction valve 581, and switching means 583 for switching between the first restriction valve 581 and the second restriction valve 582.

As depicted in FIG. 2, the upper surface and side surface of the turn table 17 are covered with a turn table cover 19. In FIG. 1, the turn table cover 19 is not depicted. The turn table cover 19 is formed with a circular opening 190, through which the support member 33 formed on the upper surface of the turn table 17 for supporting each chuck table 30 is inserted. In this condition, the upper surface and side surface of the turn table 17 are covered with the turn table cover 19. Further, the outer circumferential portion of the turn table cover 19 is formed with a gutter portion 191 for receiving the slurry drained from the opening 55 of the pipe 54.

There will now be described the operation of the polishing apparatus 1 in polishing the wafer W by using the polishing apparatus 1. In the polishing operation for the wafer W, the turn table 17 is rotated about its axis to thereby move the chuck table 30 on which the wafer W is not placed, to the standby position set near the loading arm 154a. In this condition, one of the plural wafers W is drawn from the first cassette 150a by operating the robot 155. The wafer W drawn is next transferred to the temporary setting area 152 by operating the robot 155. In the temporary setting area 152, the wafer W is set at a predetermined position by operating the positioning means 153. The wafer W is next transferred from the positioning means 153 to the chuck table 30 set at the standby position by operating the loading arm 154a. Thereafter, the wafer W is placed on the holding surface 300a of the chuck table 30 in the condition where the upper surface Wb of the wafer W is oriented upward. At this time, the center of the wafer W is made to substantially coincide with the center of the chuck table 30. In this condition, a suction force produced by the vacuum source (not depicted) connected to the chuck table 30 is transmitted to the holding surface 300a, thereby holding the wafer W on the chuck table 30 under suction.

Thereafter, the turn table 17 is rotated counterclockwise as viewed from the +Z side, so that the chuck table 30 holding the wafer W is moved from the standby position to the working position set below the polishing means 4. In the working position, the wafer W held on the chuck table 30 is positioned relative to the polishing pad 44 of the polishing means 4. This positioning is performed so that the center of rotation of the chuck table 30 is shifted from the center of rotation of the polishing pad 44 in the +X direction by a predetermined distance and the outer circumference of the holding surface 300a of the chuck table 30 is partially overlapped with the outer circumference of the polishing surface 44b of the polishing pad 44.

After performing this positioning between the polishing pad 44 and the wafer W, the spindle 40 is rotated counterclockwise as viewed from the +Z side by operating the motor 42, thereby rotating the polishing pad 44. Further, the polishing means 4 is fed in the −Z direction by operating the feeding means 2. Accordingly, the polishing surface 44b of the polishing pad 44 being rotated comes into pressure contact with the wafer W as depicted in FIG. 3. At the same time, the chuck table 30 holding the wafer W is also rotated about its axis counterclockwise as viewed from the +Z side, so that the wafer W is rotated with the chuck table 30 in the same direction. Accordingly, the whole of the upper surface Wb of the wafer W is polished by the polishing pad 44.

Figure 4:
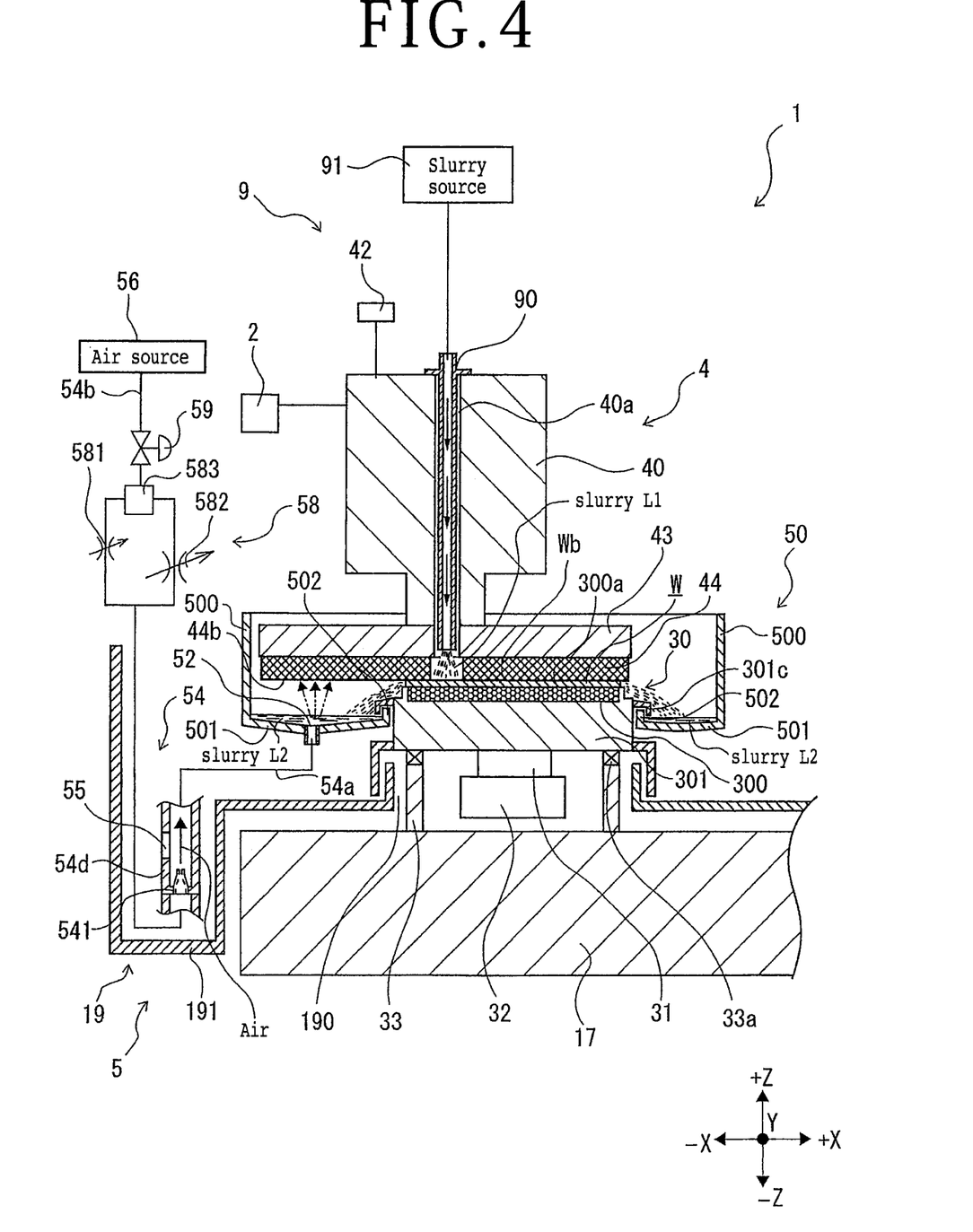
FIG. 4 is a view similar to FIG. 2, depicting a condition obtained by supplying a slurry from slurry supplying means to the polishing means in polishing the wafer held on the chuck table by operating the polishing means.

During polishing, a polishing slurry is supplied from the slurry source 91 into the slurry supply pipe 90 inserted in the through hole 40a of the spindle 40 at a predetermined rate (e.g., 100 to 200 ml/minute) as depicted in FIG. 4. The polishing slurry thus supplied into the slurry supply pipe 90 is depicted as a slurry L1 in FIG. 4. The slurry L1 is discharged from the lower end of the slurry supply pipe 90 and supplied to a contact area between the polishing surface 44b of the polishing pad 44 and the wafer W. Accordingly, during polishing, the slurry L1 is interposed between the upper surface Wb of the wafer W being rotated and the polishing surface 44b of the polishing pad 44 being rotated. As a result, a chemical action by the slurry L1 and a mechanical action by the rotation of the polishing pad 44 are combined during polishing, thereby removing grinding strain from the upper surface Wb of the wafer W.

The slurry L1 supplied to the contact area between the wafer W and the polishing surface 44b of the polishing pad 44 is used for polishing to mix with polishing dust generated at this contact area. Then, the slurry L1 flows down with the polishing dust from the outer circumference of the holding surface 300a of the chuck table 30 into the receptacle 50. As a modification, a separate nozzle for discharging the slurry L1 may be provided above the receptacle 50. In this case, the slurry L1 may be supplied from the slurry supplying means to this nozzle and may be directly discharged from this nozzle provided outside the polishing means 4 into the receptacle 50.

During polishing, the slurry L1 flowing down into the receptacle 50 is stored into the receptacle 50 in the following manner. First, the valve 59 of the slurry circulating means 5 is opened to thereby supply air from the air source 56 into the pipe 54. The air supplied into the pipe 54 is restricted in flow rate to a first flow rate (e.g., 30 L/minute) by the first restriction valve 581. Thus, the air adjusted in flow rate is allowed to flow in the pipe 54 toward the air blow opening 52. At this time, the velocity of the air flowing in the pipe 54 from the air source 56 to the air blow opening 52 can be increased by the hose nipple 541 provided in the pipe 54. Since the hose nipple 541 is provided in the vicinity of the opening 55 formed through the side wall 54d of the pipe 54, the air flows straight in the pipe 54 in the vicinity of the opening 55 at a high velocity, so that there is almost no possibility of air leakage from the opening 55. The opening of the hose nipple 54 may be located nearer to the opening 55 of the pipe 54 to thereby further reduce the air leakage from the opening 55.

The air supplied to the air blow opening 52 is blown upward from the air blow opening 52, so that the slurry L1 flowing down into the receptacle 50 is prevented from being discharged from the air blow opening 52 into the pipe 54. Accordingly, the slurry L1 is stored into the receptacle 50. The slurry L1 thus stored in the receptacle 50 is depicted as a slurry L2 in FIG. 4. When the amount of the slurry L2 stored in the receptacle 50 reaches a predetermined amount (e.g., approximately 100 to 200 ml), the supply of the slurry L1 from the slurry source 91 to the slurry supply pipe 90 is stopped. Thereafter, the switching means 583 is operated to switch the first restriction valve 581 to the second restriction valve 582 in order that the flow rate of the air flowing in the pipe 54 is increased to thereby spray the slurry L2 stored in the receptacle 50 toward the polishing surface 44b of the polishing pad 44 overhanging from the holding surface 300a of the chuck table 30 in the polishing position. That is, since the second restriction valve 582 is wider in opening than the first restriction valve 581, the flow rate of the air flowing in the pipe 54 is adjusted to a second flow rate (e.g., 50 L/minute) greater than the first flow rate mentioned above.

By increasing the flow rate of the air flowing in the pipe 54 from the first flow rate to the second flow rate, the pressure of the air blown from the air blow opening 52 into the slurry L2 stored in the receptacle 50 is increased to thereby upward spray the slurry L2 toward the polishing surface 44b of the polishing pad 44. Accordingly, the slurry L2 stored in the receptacle 50 is forced by the increased pressure of the air blown from the air blow opening 52, thereby reaching the polishing surface 44b of the polishing pad 44 overhanging from the holding surface 300a of the chuck table 30. In this manner, the slurry L2 is circulatedly supplied to the polishing surface 44b of the polishing rod 44 during polishing.

The slurry L2 supplied to the overhanging portion of the polishing surface 44b (lower surface) of the polishing pad 44 being rotated is carried with the polishing pad 44 by the rotation thereof and then adheres also to the upper surface Wb of the wafer W. In this manner, the slurry L2 is used for the polishing of the upper surface Wb of the wafer W and next flows down into the receptacle 50.

Figure 5:
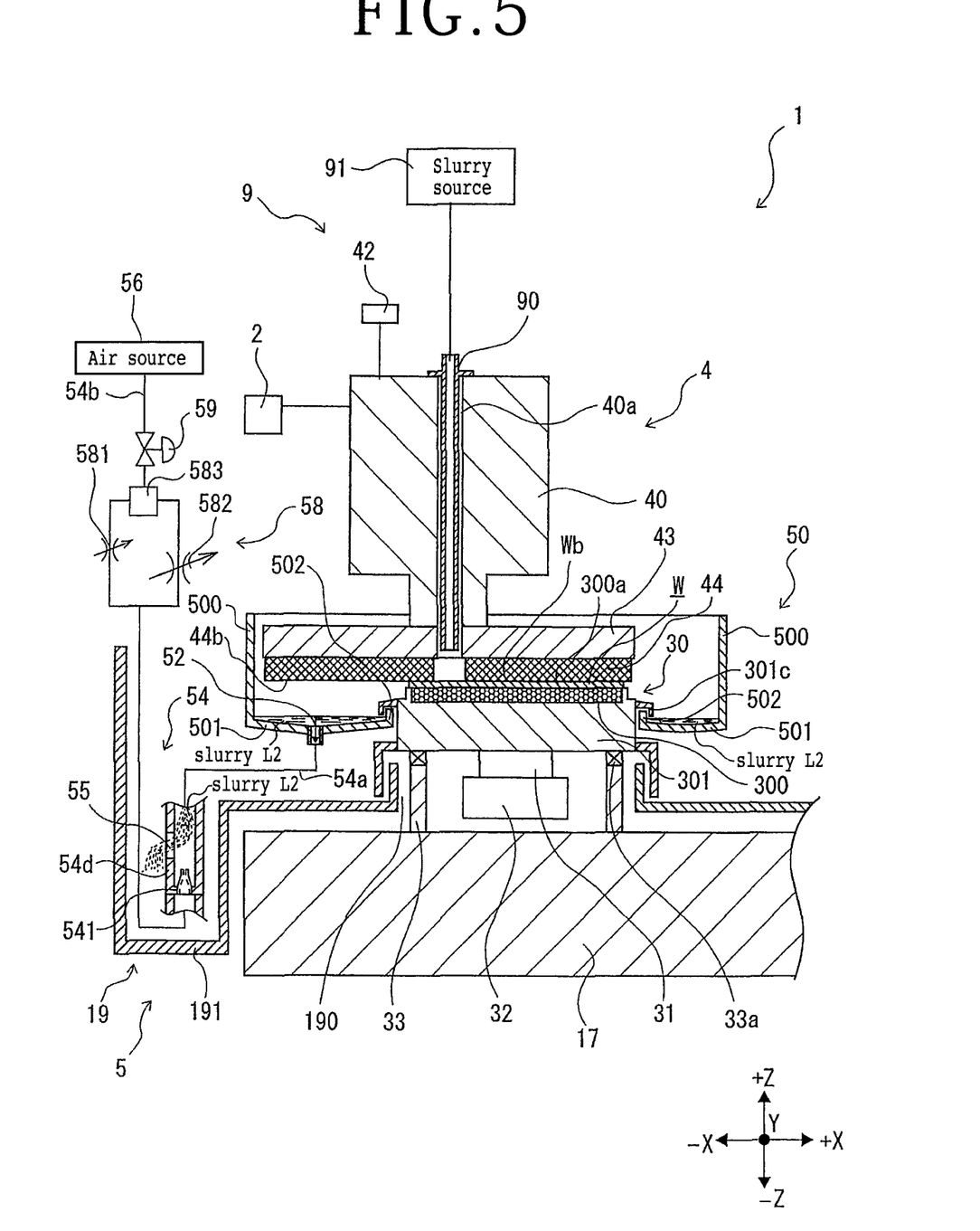
FIG. 5 is a view similar to FIG. 2, depicting a condition obtained by draining the slurry stored in a receptacle from an opening of a pipe.

After finishing the polishing of one wafer W, the feeding means 2 is operated to move the polishing means 4 in the +Z direction and separate the polishing pad 44 from the wafer W polished. Further, the valve 59 is closed to stop the supply of air from the air source 56 to the pipe 54. When the supply of air to the pipe 54 is stopped, the slurry L2 stored in the receptacle 50 is allowed to enter the pipe 54 from the air blow opening 52 serving also as a slurry drain opening as depicted in FIG. 5. That is, the slurry L2 used is removed from the receptacle 50.

The slurry L2 drained from the air blow opening 52 of the receptacle 50 to the pipe 54 is allowed to flow in the pipe 54. When the slurry L2 reaches the opening 55 of the pipe 54, the slurry L2 is drained from the opening 55 to the gutter portion 191 of the turn table cover 19. The slurry L2 drained into the gutter portion 191 of the turn table cover 19 is not reused, but discarded as a polishing waste liquid to the outside of the polishing apparatus 1. As depicted in FIG. 5, the hose nipple 541 is provided in the pipe 54, and the inner diameter of the hose nipple 541 is smaller than that of the pipe 54. Accordingly, the slurry L2 flowing in the pipe 54 is drained from the opening 55 rather than flowing through the hose nipple 541. In the case that the hose nipple 541 is not provided in the pipe 54, the slurry L2 flowing in the pipe 54 is stopped by the valve 59 closed, and finally drained from the opening 55.

Thereafter, the rotation of the chuck table 30 holding the wafer W polished is stopped, and the turn table 17 depicted in FIG. 1 is rotated about its axis counterclockwise as viewed from the +Z side, thereby moving the chuck table 30 holding the wafer W polished from the working position to the standby position set near the unloading arm 154b. In this standby position, the wafer W is unloaded from the chuck table 30 by the unloading arm 154b. Thereafter, a new wafer W to be polished is loaded to the chuck table 30 in the standby position by the loading arm 154a. Thereafter, this new wafer W is similarly polished by the polishing means 4. In polishing this new wafer W, the slurry L2 used for polishing of the previous wafer W has already been drained from the receptacle 50. Accordingly, in polishing the new wafer W, the slurry L1 is newly supplied from the slurry source 91 to the contact area between the wafer W and the polishing surface 44b of the polishing pad 44 and then stored as the slurry L2 in the receptacle 50. Thereafter, the slurry L2 newly stored in the receptacle 50 is supplied to the overhanging portion of the polishing surface 44b of the polishing pad 44 being rotated, by using the slurry circulating means 5. Accordingly, it is possible to ensure the uniformity between polishing of the previous wafer W and polishing of the new wafer W.

As described above, the polishing apparatus 1 according to the present invention includes the slurry circulating means 5 for storing a slurry below the chuck table 30 and circulating the slurry to the polishing surface 44b of the polishing pad 44. The slurry circulating means 5 includes the annular cup-shaped receptacle 50 configured so as to surround the chuck table 30 and the polishing pad 44 overhanging from the holding surface 300a of the chuck table 30 in the polishing position where the polishing surface 44b of the polishing pad 44 is in contact with the wafer W held on the chuck table 30, the air blow opening 52 formed through the bottom plate portion 501 of the receptacle 50 for blowing air to thereby spray the slurry stored in the receptacle 50 toward the polishing surface 44b of the polishing pad 44 overhanging from the holding surface 300a of the chuck table 30, the pipe 54 for connecting the air blow opening 52 and the air source 56, the opening 55 formed through the side wall of the pipe 54, and the valve 59 for controlling the supply and stop of air from the air source 56 to the pipe 54. In storing the slurry into the receptacle 50, the valve 59 is opened to supply the air from the air source 56 to the pipe 54, and the slurry supplied to the polishing surface 44b by the slurry supplying means 9 is stored into the receptacle 50 by blowing the air from the air blow opening 52. In draining the slurry from the receptacle 50, the valve 59 is closed to stop the supply of the air and use the air blow opening 52 as a slurry drain opening, so that the slurry is allowed to flow in the pipe 54 in the direction opposite to the flow direction of the air, and is finally drained from the opening 55 of the pipe 54. With this configuration, a small amount of slurry can be circulated during polishing of the wafer W, thereby suppressing the consumption of the slurry. Further, every time the wafer W to be polished is exchanged, the slurry stored in the receptacle 50 is exchanged, so that the uniformity of polishing between the wafers W can be ensured. In exchanging the slurry, the supply of a new slurry into the receptacle 50 and the drainage of an old slurry from the receptacle 50 can be controlled by controlling the supply and stop of air to the pipe 54. Accordingly, the slurry can be easily exchanged without complicating the configuration of the polishing apparatus 1.

Further, the slurry circulating means 5 further includes the restrictor 58 provided in a portion of the pipe 54 between the air source 56 and the opening 55 for adjusting the flow rate of air to be supplied from the air source 56 to the pipe 54. The restrictor 58 includes the first restriction valve 581 for adjusting the flow rate of air in the pipe 54 to a first flow rate in storing the slurry into the receptacle 50, the second restriction valve 582 adapted to open wider than the first restriction valve 581 for adjusting the flow rate of air in the pipe 54 to a second flow rate greater than the first flow rate in spraying the slurry stored in the receptacle 50 toward the polishing surface 44b of the polishing pad 44 overhanging from the holding surface 300a of the chuck table 30, and the switching means 583 for switching between the first restriction valve 581 and the second restriction valve 582. With this configuration, it is possible to easily switch between the storage of the slurry into the receptacle 50 and the supply of the slurry stored in the receptacle 50 to the polishing surface 44b of the polishing pad 44.

The polishing apparatus 1 according to the present invention is not limited to the above preferred embodiment. Further, the size, shape, etc. of each component of the polishing apparatus 1 are not limited to those depicted in the attached drawings, but may be suitably changed within the scope where the objects of the present invention can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A polishing apparatus comprising:
a chuck table having a holding surface for holding a wafer;
polishing means comprising a rotatable polishing pad having a polishing surface for polishing the wafer held on the chuck table;
slurry supplying means for supplying a slurry to the polishing surface;
feeding means for feeding the polishing means in a direction toward or away from an upper surface of the wafer held on the chuck table; and
slurry circulating means for storing the slurry below the chuck table and circulating the slurry to the polishing surface of the polishing pad;
the slurry circulating means comprising:
an annular cup-shaped receptacle configured so as to surround the chuck table and the polishing pad overhanging from the holding surface of the chuck table in a polishing position where the polishing surface of the polishing pad is in contact with the wafer held on the chuck table,
an air blow opening formed through a bottom plate portion of the receptacle for blowing air to thereby spray the slurry stored in the receptacle toward the polishing surface of the polishing pad overhanging from the holding surface of the chuck table,
a pipe for connecting the air blow opening to an air source,
an opening formed through a side wall of the pipe, and
a valve for controlling supply and stop of air from the air source to the pipe,
a gutter for collecting slurry from the receptacle, the pipe positioned in the gutter,
wherein when storing the slurry into the receptacle, the valve is opened to supply the air from the air source to the pipe, and the slurry supplied to the polishing surface by the slurry supplying means is stored into the receptacle by blowing the air from the air blow opening, whereas when draining the slurry from the receptacle, the valve is closed to stop the supply of the air and to use the air blow opening as a slurry drain opening, so that the slurry is allowed to flow in the pipe in a direction opposite to a flow direction of the air, and is finally drained from the opening of the pipe into the gutter.

2. The polishing apparatus according to claim 1, wherein the slurry circulating means further comprises a restrictor provided in a portion of the pipe between the air source and the opening of the pipe for adjusting a flow rate of air supplied from the air source to the pipe,
the restrictor comprising a first restriction valve for adjusting the flow rate of the air in the pipe to a first flow rate when storing the slurry into the receptacle, a second restriction valve configured to open wider than the first restriction valve for adjusting the flow rate of the air in the pipe to a second flow rate greater than the first flow rate when spraying the slurry stored in the receptacle toward the polishing surface of the polishing pad overhanging from the holding surface of the chuck table, and switching means for switching between the first restriction valve and the second restriction valve.

3. The polishing apparatus of claim 1 further comprising:
a hose nipple in the pipe positioned upstream of the opening of the pipe in the flow directions of the air.

4. The polishing apparatus of claim 1 wherein the slurry supply means comprises a slurry supply pipe connected to a slurry supply.

5. The polishing apparatus of claim 1 wherein the feeding means comprises includes a ball screw having an axis extending in the vertical direction, a pair of guide rails parallel to the ball screw, a motor connected to the ball screw for rotating the ball screw, a movable plate having an internal nut engaged with the ball screw and having a rear side surface adapted to slide on the guide rails, and a holder connected to the movable plate on its front side surface for holding the polishing means.

6. The polishing apparatus of claim 1 wherein the receptacle comprises an outer wall portion, the bottom plate portion, and an inner wall portion, and wherein the outer wall portion has a height greater than a height of the polishing pad when the polishing pad is in contact with the wafer on the chuck table.

7. The polishing apparatus of claim 1 wherein there are a plurality of air blow openings in the bottom plate portion.

8. The polishing apparatus of claim 1 further comprising a turn table and wherein the chuck table is positioned on the turntable.

9. The polishing apparatus of claim 8 further comprising a turn table cover covering an upper surface and a side surface of the turn table, and wherein the gutter is a part of the turn table cover.

10. A polishing apparatus comprising:
   a chuck table having a holding surface for holding a wafer;
   polishing means comprising a rotatable polishing pad having a polishing surface for polishing the wafer held on the chuck table;
   slurry supplying means for supplying a slurry to the polishing surface;
   feeding means for feeding the polishing means in a direction toward or away from an upper surface of the wafer held on the chuck table; and
   slurry circulating means for storing the slurry below the chuck table and circulating the slurry to the polishing surface of the polishing pad;
   the slurry circulating means comprising:
      an annular cup-shaped receptacle configured so as to surround the chuck table and the polishing pad overhanging from the holding surface of the chuck table in a polishing position where the polishing surface of the polishing pad is in contact with the wafer held on the chuck table,
      an air blow opening formed through a bottom plate portion of the receptacle for blowing air to thereby spray the slurry stored in the receptacle toward the polishing surface of the polishing pad overhanging from the holding surface of the chuck table,
      a pipe for connecting the air blow opening to an air source,
      an opening formed through a side wall of the pipe, and
      a valve for controlling supply and stop of air from the air source to the pipe,
      a restrictor provided in a portion of the pipe between the air source and the opening of the pipe for adjusting a flow rate of air supplied from the air source to the pipe, the restrictor comprising a first restriction valve for adjusting the flow rate of the air in the pipe to a first flow rate when storing the slurry into the receptacle, a second restriction valve configured to open wider than the first restriction valve for adjusting the flow rate of the air in the pipe to a second flow rate greater than the first flow rate when spraying the slurry stored in the receptacle toward the polishing surface of the polishing pad overhanging from the holding surface of the chuck table, and
      switching means for switching between the first restriction valve and the second restriction valve,
   wherein when storing the slurry into the receptacle, the valve is opened to supply the air from the air source to the pipe, and the slurry supplied to the polishing surface by the slurry supplying means is stored into the receptacle by blowing the air from the air blow opening, whereas when draining the slurry from the receptacle, the valve is closed to stop the supply of the air and to use the air blow opening as a slurry drain opening, so that the slurry is allowed to flow in the pipe in a direction opposite to a flow direction of the air, and is finally drained from the opening of the pipe.

11. The polishing apparatus of claim 10 further comprising:
   a hose nipple in the pipe positioned upstream of the opening of the pipe in the flow directions of the air.

12. The polishing apparatus of claim 10 wherein the slurry supply means comprises a slurry supply pipe connected to a slurry supply.

13. The polishing apparatus of claim 10 wherein the feeding means comprises includes a ball screw having an axis extending in the vertical direction, a pair of guide rails parallel to the ball screw, a motor connected to the ball screw for rotating the ball screw, a movable plate having an internal nut engaged with the ball screw and having a rear side surface adapted to slide on the guide rails, and a holder connected to the movable plate on its front side surface for holding the polishing means.

14. The polishing apparatus of claim 10 wherein the receptacle comprises an outer wall portion, the bottom plate portion, and an inner wall portion, and wherein the outer wall portion has a height greater than a height of the polishing pad when the polishing pad is in contact with the wafer on the chuck table.

15. The polishing apparatus of claim 10 wherein there are a plurality of air blow openings in the bottom plate portion.

16. The polishing apparatus of claim 10 further comprising a turn table and wherein the chuck table is positioned on the turntable.

17. The polishing apparatus of claim 10 further comprising:
   a gutter for collecting used slurry, the pipe positioned in the gutter.

18. The polishing apparatus of claim 17 further comprising:
   a turn table and wherein the chuck table is positioned on the turntable,
   a turn table cover covering an upper surface and a side surface of the turn table, and wherein the gutter is a part of the turn table cover.

* * * * *